(12) United States Patent
Hall

(10) Patent No.: US 9,179,570 B2
(45) Date of Patent: Nov. 3, 2015

(54) MULTI CONNECTOR INTERCONNECT SYSTEM

(71) Applicant: Simmonds Precision Products, Inc., Vergennes, VT (US)

(72) Inventor: Robbie William Hall, Vergennes, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 159 days.

(21) Appl. No.: 13/951,112

(22) Filed: Jul. 25, 2013

(65) Prior Publication Data

US 2014/0036470 A1 Feb. 6, 2014

Related U.S. Application Data

(60) Provisional application No. 61/677,560, filed on Jul. 31, 2012.

(51) Int. Cl.
*H05K 7/06* (2006.01)
*H05K 7/14* (2006.01)

(52) U.S. Cl.
CPC ............... *H05K 7/06* (2013.01); *H05K 7/1421* (2013.01)

(58) Field of Classification Search
CPC ........................................ H05K 7/06
USPC ................................. 361/790, 807
See application file for complete search history.

(56) References Cited

U.S. PATENT DOCUMENTS

| 7,511,967 B2* | 3/2009 | Loda .......................... 361/790 |
| 2008/0239689 A1* | 10/2008 | Okamoto et al. ............. 361/807 |
| 2008/0273316 A1* | 11/2008 | Sarno et al. .................. 361/807 |

* cited by examiner

*Primary Examiner* — Forrest M Phillips
(74) *Attorney, Agent, or Firm* — Locke Lord LLP; Joshua L. Jones; Scott D. Wofsy

(57) ABSTRACT

The subject invention is directed to a new and useful line replaceable unit (LRU) including an LRU case defining an interior compartment for housing critical function circuit card assemblies and including a back plane wall and opposed interface wall. At least one critical function circuit card assembly (CCA) is housed within the LRU case. The critical function CCA includes an input output connector mounted in proximity to the interface wall, as well as a backplane connector. The LRU includes a backplane CCA operatively connected to each backplane connector of the at least one critical function CCA. The backplane CCA is configured and adapted to provide operative communication among multiple critical function CCA's. The critical function CCA's can be mounted to the LRU case proximate the interface wall and the backplane wall to be mechanically and electrically isolated from one another except for connections provided by the backplane CCA.

15 Claims, 4 Drawing Sheets

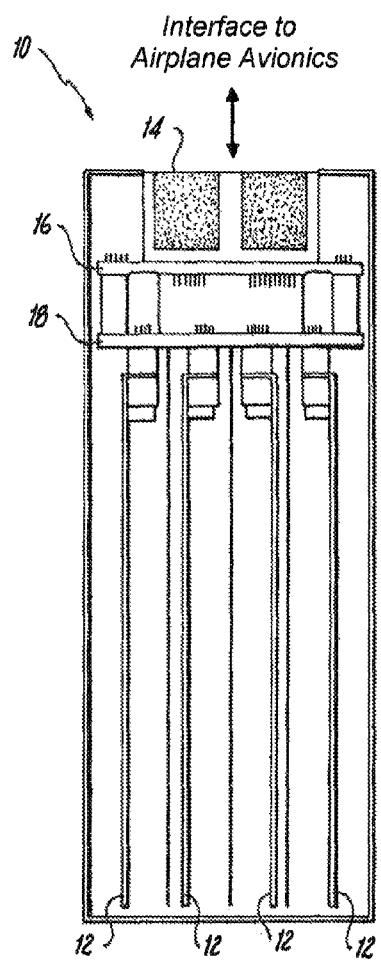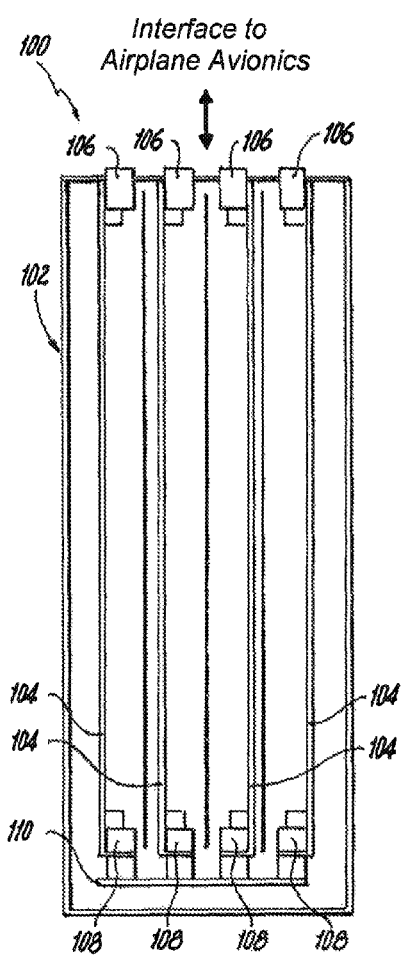
Fig. 1
(Prior Art)
Fig. 2

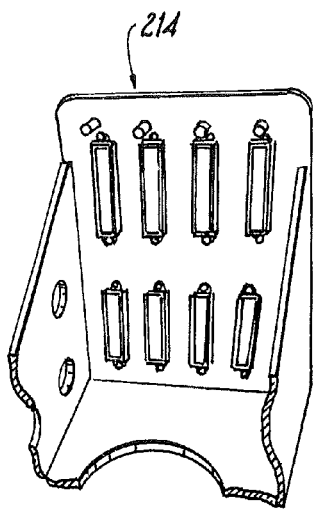
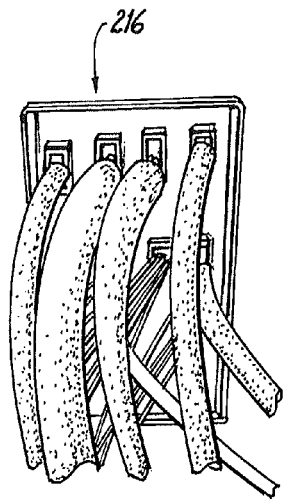
Fig. 9  Fig. 10
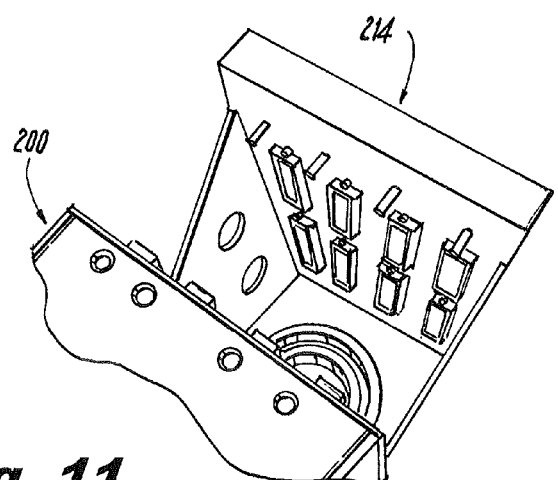
Fig. 11

MULTI CONNECTOR INTERCONNECT SYSTEM

BACKGROUND OF THE INVENTION

1. Field of the Invention

The present invention relates to line replaceable units, and more particularly to interconnection systems for line replaceable units.

2. Description of Related Art

A variety of devices and systems are known in the art for connecting line replaceable units (LRU's) to other systems. For example, LRU's on aircraft connect to avionics for control and monitoring of various aspects of the aircraft. Typical LRU's are designed to be readily connected and disconnected from the surrounding systems, e.g., the avionics, for easy LRU replacement or upgrade.

Such conventional methods and systems have generally been considered satisfactory for their intended purpose. However, there is still a need in the art for systems and methods that allow for improved operability in LRU's, including enhanced flexibility and reliability, as well as reduced cost. There also remains a need in the art for such systems and methods that are easy to make and use. The present invention provides a solution for these problems.

SUMMARY OF THE INVENTION

The subject invention is directed to a new and useful line replaceable unit (LRU) including an LRU case defining an interior compartment for housing critical function circuit card assemblies and including a back plane wall and opposed interface wall. At least one critical function circuit card assembly (CCA) is housed within the LRU case. The critical function CCA includes an input output connector mounted in proximity to the interface wall, as well as a backplane connector. The LRU includes a backplane CCA operatively connected to each backplane connector of the at least one critical function CCA. The backplane CCA is configured and adapted to provide operative communication among multiple critical function CCA's.

In accordance with one aspect of the invention, a circuit card assembly for an LRU as described above includes a critical function CCA body with on board electronics. For example, the on board electronics can be configured and adapted to provide control and monitoring of aircraft systems, or the like. The input output connector is mounted to the critical function CCA body in electrical communication with the on board electronics. The backplane connector is mounted to the critical function CCA body in electrical communication with the on board electronics. The at least one backplane connector is configured and adapted to electrically connect the on board electronics to the backplane CCA as described above for communication among multiple critical function CCA's.

In certain embodiments, the on board electronics and input output connector are configured and adapted to operatively connect directly to aircraft avionics input output lines via an ARINC tray/connector. Such an ARINC tray/connector is in turn configured and adapted to receive an ARINC tray harness for connecting input and output lines to the critical function CCA.

In another aspect, the critical function circuit card assembly body is generally planar to define a card plane. The input output connector has a longitudinal dimension aligned with the card plane for nesting multiple critical function circuit card assemblies closely together with respective card planes parallel to one another. The input output connector can be a d-connector, or any other suitable type of connector. The input output connector and the backplane connector can be aligned in opposite directions from one another.

In accordance with certain embodiments, there are at least two critical function circuit card assemblies. The critical function circuit card assemblies are mounted to the line replaceable unit case proximate the interface wall and the backplane wall to be mechanically and electrically isolated from one another except for connections provided by the backplane CCA. The critical function CCA's can include first and second fuel level monitoring CCA's that are electro-mechanically isolated from one another. The fuel level monitoring CCA's operatively connect only via the backplane CCA to avoid interfering with one another.

These and other features of the systems and methods of the subject invention will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain figures, wherein:

FIG. 1 is a schematic view of an exemplary line replaceable unit (LRU) in accordance with the state of the art, showing each critical function circuit card assembly (CCA) connecting to an ARINC connector by way of two interconnect CCA's;

FIG. 2 is a schematic view of an exemplary embodiment of an LRU constructed in accordance with the present invention, showing the critical function CCA's with ruggedized d-connectors for direct connection to avionics, and a backplane CCA at the opposite end of the critical function CCA's;

FIG. 9 is a perspective view of the ARINC tray interface for use with the LRU of FIG. 5, showing the avionics interface connectors for connecting to the d-connectors of multiple critical function CCA's;

FIG. 10 is a perspective view of an ARINC tray harness for use with an LRU of FIG. 5, showing the avionics input output lines harnessed together for attachment to the LRU; and FIG. 11 is a perspective view of an ARINC tray interface and the LRU of FIG. 5, showing the alignment of the ARINC tray interface as it is mated with the d-connectors in the LRU.

DETAILED DESCRIPTION OF THE PREFERRED EMBODIMENTS

Figure 3:
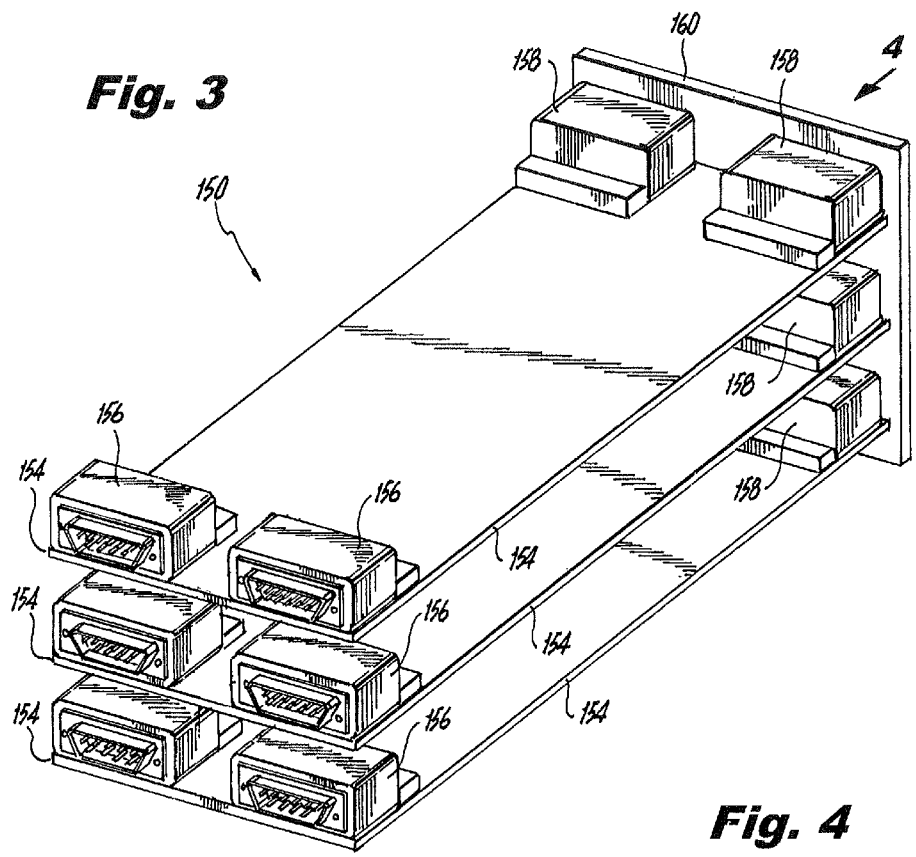
FIG. 3 is a schematic perspective view of a portion another exemplary embodiment of an LRU constructed in accordance with the present invention, showing six critical function CCA's connected to the backplane CCA.

Reference will now be made to the drawings wherein like reference numerals identify similar structural features or aspects of the subject invention. For purposes of explanation and illustration, and not limitation, a partial view of an exemplary embodiment of a line replaceable unit (LRU) in accordance with the invention is shown in FIG. 2 and is designated generally by reference character 100. Other embodiments of LRU's in accordance with the invention, or aspects thereof, are provided in FIGS. 3-11, as will be described. The systems and methods of the invention can be used to improve flexibility and adaptability in LRU configuration, as well as increased reliability.

With reference first to FIG. 1, a typical LRU, for aircraft avionics as an example, includes a case 10 housing multiple critical function circuit card assemblies (CCA's) 12, which include circuitry for monitoring and/or controlling various aspects of the aircraft. The various avionics input output lines from the air craft systems connect to the LRU through an ARINC connector 14, e.g., the ARINC 600. The ARINC connector 14 is connected to a first interconnect CCA 16 which routes the various connections from ARINC connector 14 to a second interconnect CCA 18. Second interconnect CCA 18 routes the connections from first interconnect CCA to the respective critical function CCA's 12.

With reference now to FIG. 2, LRU 100 constructed in accordance with the present invention eliminates the interconnect CCA's. LRU 100 includes a case 102 with an interior compartment that houses four critical function CCA's 104. Each critical function CCA 104 includes its own input output d-connector 106 for a direct electrical connection between the avionics input output lines from the aircraft and the electronics onboard each respective critical function CCA 104. For example, the on board electronics can be configured and adapted to provide control and monitoring of aircraft systems, or the like. Opposite the d-connector 106 on each critical function CCA 104 is a backplane connector 108 that is also in electrical communication with the onboard electronics of the respective critical function CCA 104.

The input output connectors and the backplane connectors are aligned in opposite directions from one another, however those skilled in the art will readily appreciate that the backplane connectors 108 can be on an edge of the card body oriented 90° degrees from the direction of the input output connectors, or in any other suitable orientation or position without departing from the spirit and scope of the invention. A backplane CCA 110 has connectors for receiving the backplane connectors 108 and associated onboard electronics to provide for communication between the critical function CCA's 104. Case 102 includes an interface wall, where the d-connectors 106 are mounted, and an opposed backplane wall proximate the backplane CCA 110. The critical function CCA's 104 are mounted to LRU case 102 proximate the interface wall and proximate the backplane wall to be mechanically and electrically isolated from one another except for connections provided by the backplane CCA 110. Respective critical function CCA's 104 and d-connectors 106 are isolated from the others.

Figure 4:
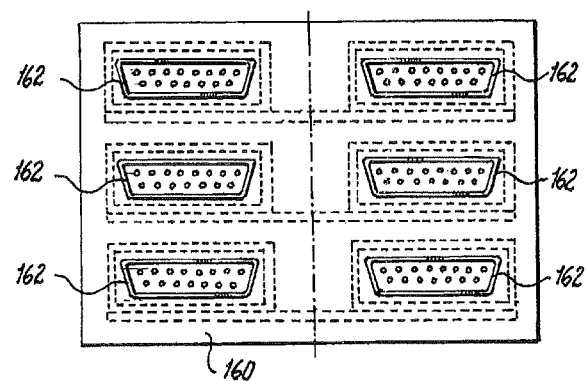
FIG. 4 is a schematic plan view of the backplane CCA of FIG. 3, showing the connectors for attachment of the critical function CCA's.

With reference now to FIG. 3, another exemplary LRU 150 is shown with case 152 removed to show the internal structure of the CCA's. This exemplary embodiment includes three critical function CCA's, each with two connectors so there are six total ruggedized d-connectors at the interface end. FIG. 4 shows the six connectors 162 on backplane CCA 160 for receiving the respective backplane connectors 168 of the critical function CCA's 164. The vertical line in FIG. 4 depicts a physical separation between functions on the same CCA. These functions communicate via independent dedicated d-connectors 162. Those skilled in the art will readily appreciate that the vertical separation is exemplary, and that without departing from the scope of this disclosure, in suitable applications the vertical line separation on the back plane is not necessary.

Figure 5:
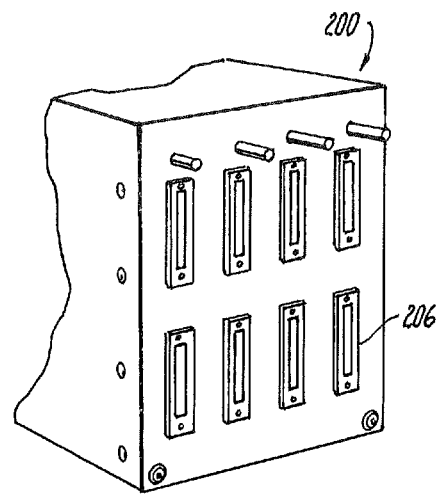
FIG. 5 is a perspective view of another exemplary embodiment of an LRU constructed in accordance with the present invention, showing the d-connector interface.
Figure 6:
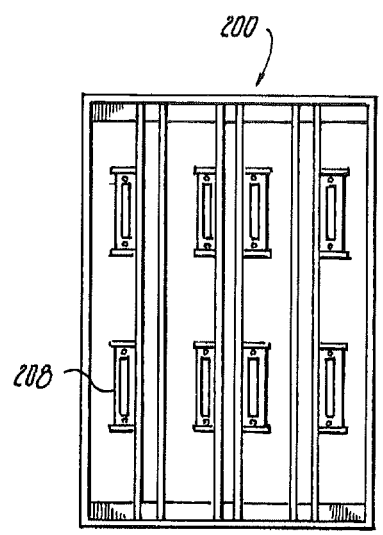
FIG. 6 is a backplane elevation view of the LRU of FIG. 5, showing the critical function CCA's with the backplane CCA removed.
Figure 7:
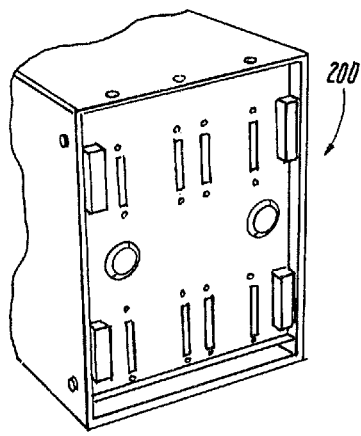
FIG. 7 is a perspective view of the LRU of FIG. 5, showing the backplane CCA installed in the LRU.
Figure 8:
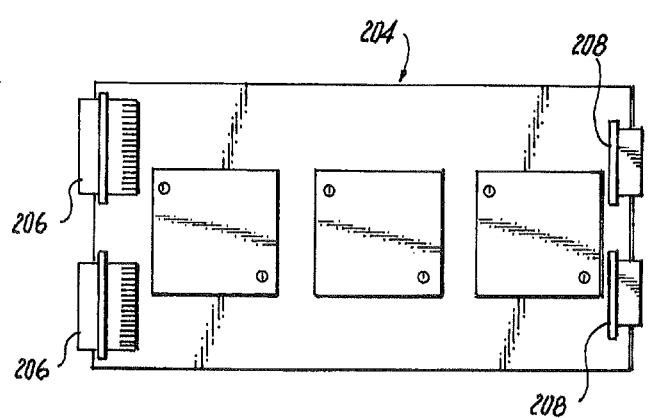
FIG. 8 is a plan view of a critical function CCA for use with the LRU of FIG. 5, showing the d-connectors on the left and the backplane connectors on the right.

With reference now to FIGS. 5-8, an exemplary embodiment of LRU 200 is shown that is much like LRU 150 described above, but with four critical function CCA's 204, each of which uses two d-connectors 206 and two backplane connectors 208. FIG. 5 shows the interface wall with the eight d-connectors 206, and FIG. 7 shows the LRU opposite the interface wall side of LRU 200 with the backplane CCA installed. In FIG. 6, the backplane wall and backplane CCA are removed to show the eight backplane connectors 208 of the four critical function CCA's 204. In FIG. 8, a single critical function CCA is shown with the onboard electronics on the card body between the connectors 206 and 208.

With continued reference to FIG. 8, critical function CCA 204 has a main body that is generally planar to define a card plane. Each of the input output connectors, i.e. d-connectors 206, has a longitudinal dimension aligned with the card plane for nesting multiple critical function CCA's closely together with respective card planes parallel to one another. In other words, the connectors of the critical function CCA's are relatively flat geometrically for compactness so several critical function CCA's can fit within a relatively compact LRU case. Those skilled in the art will readily appreciate that d-connectors are exemplary only, and that the input output connectors can be of any other suitable geometric shape or type without departing from the spirit and scope of the invention. Moreover, while described herein with specific numbers of connectors, those skilled in the art will readily appreciate that any suitable number of connectors can be used without departing from the scope of this disclosure.

Referring now to FIGS. 9-11, LRU's constructed in accordance with the present invention can optionally connect to the avionics systems with or without an ARINC interface. FIG. 9 shows an ARINC tray interface 214 which can be mounted to the case of LRU 200, with eight connectors that attach directly to the eight d-connectors of the critical function CCA's at the interface wall of LRU 200 shown in FIG. 5. FIG. 10 shows avionics input output lines harnessed together in a single ARINC tray harness 216, which can all be plugged into ARINC tray interface 214 as a single unit. FIG. 11 shows ARINC tray interface 214 partially pulled away from the case of LRU 200, with the eight ARINC connectors aligned with the eight d-connectors of the critical function CCA's. The ARINC tray interface can optionally be omitted, in which case the avionics wire harnesses can connect directly to the d-connectors. Optionally, the wire harnesses themselves can also be omitted.

As one example provided for illustrative purposes and not limitation, the LRU configurations described herein can improve reliability and safety for an avionics LRU housing CCA's for fuel level monitoring systems, i.e., fuel level sensing control units "FLSCU's," and related critical function CCA's. In the traditional LRU configuration shown in FIG. 1, multiple CCA's could be dedicated to separate, respective fuel level monitoring systems on board an aircraft. Since the input output lines of the fuel level monitoring systems have to connect through the two interconnect CCA's to reach the critical function CCA's, there is an elevated risk that the CCA's will not be effectively isolated from one another. For example, in the traditional LRU of FIG. 1, the interconnect CCA's can allow cross-talk between FLSCU's or even with other non-fuel related critical function CCA's. This and similar errors can lead improper function of the FLSCU's. In contrast, the LRU systems shown in FIGS. 2-11 provide electro-mechanical isolation for the critical function CCA's from one another, since CCA's operatively connect only via the backplane CCA to avoid interfering with one another.

Additionally, since there are no interconnect CCA's proximate the interface wall of the LRU's shown in FIGS. 2-11, it is easier to switch out individual critical function CCA's. Replacement or upgrade CCA's simply need to be connected to the backplane CCA. In order to facilitate upgrades or modifications, the backplane CCA's can be configured to provide a flexible communication protocol so replacement/upgrade CCA's can effectively communicate with the other CCA's in the LRU. The backplane CCA's can provide both data bus and power bus functionality. Thus redesign of the LRU is not necessary if newer critical function CCA's are needed. These configurations thus significantly enhance not only safety and reliability, but increase flexibility and capacity for critical function CCA replacements and upgrades. The LRU's in accordance with the invention are simplified compared to traditional LRU's, which provides for reduced cost and weight as well as improved reliability. Reducing the number of interconnect CCA's advantageously reduces cost.

While backplane assemblies are shown and described herein as a backplane CCA's, e.g., backplane CCA 110, those skilled in the art will readily appreciate that any other suitable type of backplane assembly can be used without departing from the scope of this disclosure. For example, ribbon cables with connectors on each end can be used as a backplane assembly.

Those skilled in the art will readily appreciate that fuel level monitoring is an exemplary application, and that LRU systems in accordance with the invention can be used for any suitable avionic system. Moreover, those skilled in the art will readily appreciate that avionics are an exemplary application, and that LRU systems as described herein can be used in any suitable application without departing from the spirit and scope of the invention.

The methods and systems of the present invention, as described above and shown in the drawings, provide for LRU's with superior properties including improved safety and reliability as well as increased flexibility and capacity. While the apparatus and methods of the subject invention have been shown and described with reference to preferred embodiments, those skilled in the art will readily appreciate that changes and/or modifications may be made thereto without departing from the spirit and scope of the subject invention.

What is claimed is:

1. A circuit card assembly for a line replaceable unit comprising:
 a) a critical function circuit card assembly body including on board electronics;
 b) at least one input output connector mounted to the critical function circuit card assembly body in electrical communication with the on board electronics; and
 c) at least one backplane connector mounted to the critical function circuit card assembly body in electrical communication with the on board electronics, the at least one backplane connector being configured and adapted to electrically connect the on board electronics to a backplane circuit card assembly for communication among multiple critical function circuit card assemblies while providing electro-mechanical isolation for the multiple critical function circuit card assemblies from one another.

2. A circuit card assembly as recited in claim 1, wherein the on board electronics and input output connector are configured and adapted to connect directly to aircraft avionics input output lines via an ARINC connector configured and adapted to receive an ARINC tray harness.

3. A circuit card assembly as recited in claim 1, wherein the critical function circuit card assembly body is generally planar to define a card plane, and wherein the input output connector has a longitudinal dimension aligned with the card plane for nesting multiple critical function circuit card assemblies closely together with respective card planes parallel to one another.

4. A circuit card assembly as recited in claim 3, wherein the input output connector is a d-connector.

5. A circuit card assembly as recited in claim 1, wherein the on board electronics are configured and adapted to provide at least one of control and monitoring of aircraft systems.

6. A circuit card assembly as recited in claim 1, wherein the input output connector and the backplane connector are aligned in opposite directions.

7. A line replaceable unit comprising:
 a) a line replaceable unit case defining an interior compartment for housing critical function circuit card assemblies and including a back plane wall and opposed interface wall;
 b) at least one critical function circuit card assembly housed within the line replaceable unit case, the critical function circuit card assembly including an input output connector mounted in proximity to the interface wall, and a backplane connector; and
 c) a backplane circuit card assembly operatively connected to each backplane connector of the at least one critical function circuit card assembly, wherein the backplane circuit card assembly is configured and adapted to provide operative communication among multiple critical function circuit card assemblies while providing electro-mechanical isolation for the multiple critical function circuit card assemblies from one another.

8. A line replaceable unit as recited in claim 7, further comprising an ARINC connector operatively connected directly to each input output connector of the at least one critical function circuit card assembly, wherein the ARINC connector is configured and adapted to receive an ARINC tray harness for connecting input and output lines to the at least one critical function circuit card assembly.

9. A line replaceable unit as recited in claim 7, wherein each critical function circuit card assembly is generally planar to define a card plane, and wherein the input output connector of each critical function circuit card assembly has a longitudinal dimension aligned with the card plane so multiple critical function circuit card assemblies can be nested closely together with respective card planes parallel to one another.

10. A line replaceable unit as recited in claim 9, wherein the input output connector is a d-connector.

11. A line replaceable unit as recited in claim 7, wherein the at least one critical function circuit card assembly includes on board electronics configured and adapted to provide at least one of control and monitoring of aircraft systems.

12. A line replaceable unit as recited in claim 7, wherein there are at least two critical function circuit card assemblies, wherein the critical function circuit card assemblies are mounted to the line replaceable unit case proximate the interface wall and the backplane wall to be mechanically and electrically isolated from one another except for connections provided by the backplane circuit card assembly.

13. A line replaceable unit as recited in claim 7, wherein the input output connector and the backplane connector of each critical function circuit card assembly are aligned in opposite directions.

14. A line replaceable unit as recited in claim 7, wherein the at least one critical function circuit card assembly includes first and second fuel level monitoring circuit card assemblies that are electro-mechanically isolated from one another, operatively connecting only via the backplane circuit card assembly to avoid interfering with one another.

15. A circuit card assembly for a line replaceable unit comprising:
   a) a critical function circuit card assembly body including on board electronics;
   b) at least one input output connector mounted to the critical function circuit card assembly body in electrical communication with the on board electronics; and
   c) at least one backplane connector mounted to the critical function circuit card assembly body in electrical communication with the on board electronics, the at least one backplane connector being configured and adapted to electrically connect the on board electronics to a backplane assembly for communication among multiple critical function circuit card assemblies while providing electro-mechanical isolation for the multiple critical function circuit card assemblies from one another.

* * * * *